United States Patent [19]
Götz et al.

[11] Patent Number: 4,531,097
[45] Date of Patent: Jul. 23, 1985

[54] HIGH FREQUENCY AMPLIFIER

[75] Inventors: Laszlo Götz, Oberding; Hermann Kowatsch, Ebenhausen, both of Fed. Rep. of Germany

[73] Assignee: Texas Instruments Deutschland GmbH, Freising, Fed. Rep. of Germany

[21] Appl. No.: 506,180

[22] Filed: Jun. 21, 1983

[30] Foreign Application Priority Data

Jun. 22, 1982 [DE] Fed. Rep. of Germany ....... 3223229

[51] Int. Cl.³ .............................................. H03F 3/45
[52] U.S. Cl. ................................... 330/254; 330/261; 330/257
[58] Field of Search ................. 330/252, 254, 257, 261

[56] References Cited

U.S. PATENT DOCUMENTS 3,032,704 5/1962 Beck ...................................... 323/66
3,962,650 5/1976 Gay ....................................... 330/29
4,134,078 1/1979 Takao et al. .......................... 330/254

FOREIGN PATENT DOCUMENTS 3109590  1/1982  Fed. Rep. of Germany .
55-147012 11/1980 Japan .................................. 330/254
57-7606   1/1982  Japan .
57-55605  2/1982  Japan .

Primary Examiner—James B. Mullins
Assistant Examiner—G. Wan
Attorney, Agent, or Firm—Mel Sharp; N. Rhys Merrett; Gary C. Honeycutt

[57] ABSTRACT

A high frequency amplifier comprising a pair of input transistors forming a differential amplifier stage, with an impedance connected between the common terminals of the input transistors to vary the amplification factor of the amplifier stage. The variable impedance is formed by a diode bridge the a.c. terminals of which are connected to the common terminals of the input transistors and the d.c. terminals of which are connected to a circuit arrangement including current mirrors to feed a d.c. current to the diode bridge to control its impedance and hence the amplification factor of the differential amplifier stage.

8 Claims, 1 Drawing Figure

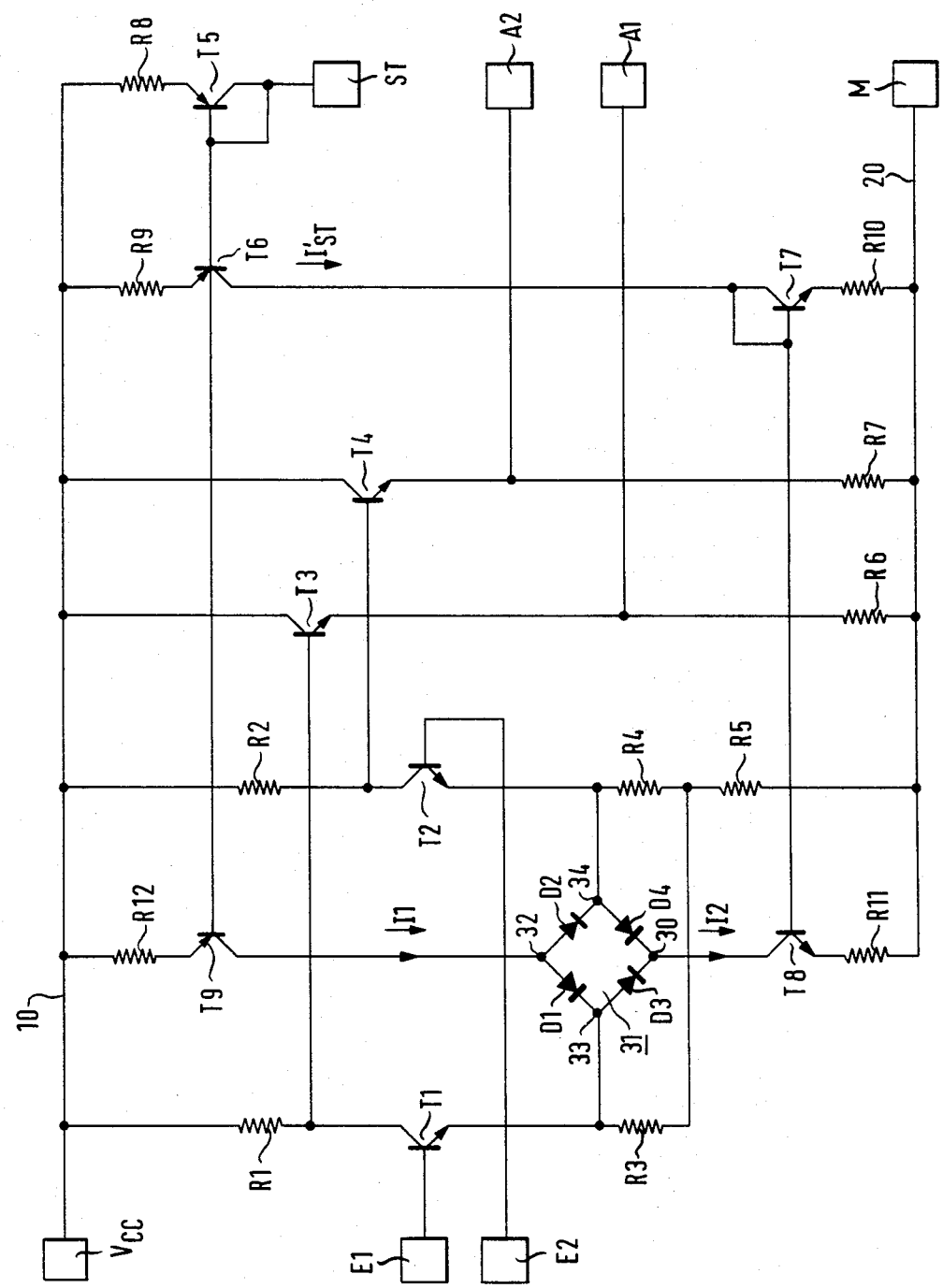

HIGH FREQUENCY AMPLIFIER

The invention relates to a high frequency amplifier comprising two input transistors forming a differential amplifier stage with an impedance variable by a dc control current interposed between the common terminals thereof to vary the amplification factor.

Such a high frequency is used in the integrated circuit Ser. No. 94,180 offered on the market by the firm, Texas Instruments. This known high frequency amplifier is employed for amplifying video signals, i.e. signals of relatively high frequencies. Between the emitters (common terminals) of the input transistors connected to function as differential amplifier stage two diodes are so interposed that their anodes are each connected to one emitter while their cathodes are interconnected. The interconnected cathodes are connected to a pin of the integrated circuit.

This pin can be supplied with a dc control current flowing through the two diodes in forward direction. The diodes have a specific forward resistance depending on the value of the dc conrtrol current so that by means of the dc control current fed to the diode cathodes it is possible to vary the effective impedance between the emitters of the input transistors forming the differential amplifier stage. Since the variation of the effective impedance between the emitters results in a variation of the amplification factor of the differential amplifier stage, a desired amplification factor of the differential amplifier stage can be adjusted by means of a dc control current supplied to one pin of the integrated circuit.

The dc control current flowing through the diodes connected to the emitters of the input transistors, in the known high frequency amplifier, also flows through the resistors in the emitter circuit of said transistors thereby influencing the quiescent dc current flowing through the input transistors. The quiescent dc current determines the operating point of the differential amplifier stage and thus also all the parameters depending on the operating point. The band width of the amplifier stage is of particular significance in this connection; it should remain substantially constant independently of any momentarily selected amplification factor. In the known high frequency amplifier this cannot be achieved, however, because the dc control current supplied for adjusting the amplification factor results in a shift of the operating point, as mentioned above.

The invention has the object of providing a high frequency amplifier with adjustable amplification factor and with an operating point that is independent of the momentarily selected amplification factor which readily lends itself of manufacture in the form of an integrated circuit.

According to the invention this object is realized in that the variable impedance is formed by a diode bridge whose ac terminals are connected to the common terminals of the input transistors and whose dc terminals are connected to a circuit arrangement for feeding the dc control current to the diode bridge.

The diode bridge employed in the high frequency amplifier of the invention permits variation of the effective impedance between the common terminals of the input transistors without causing the dc control current used for effecting the variation to flow through the common circuits of the input transistors. The operating point of the differential amplifier stage formed by the input transistors therefore is not affected by the dc control current so that the operational parameters of the differential amplifier stage are independent of the momentarily selected amplification factor. For this reason the high frequency amplifier of the invention is especially well suited for amplification of signals having very high frequencies for which it is particularly significant that the band width of the amplifier does not change upon a variation of the amplification factor.

One example of the invention will now be explained with reference to the drawing whose sole FIGURE illustrates a bipolar transistor circuit diagram of an amplifier with variable amplification factor according to the invention.

The illustrated amplifier contains a differential input stage with two NPN transistors T1 and T2. The base of the transistor T1 forms one input of the amplifier stage and is connected to the input terminal E1; the base of the transistor T2 forms the second input to the amplifier stage and is connected to the input terminal E2. A resistor R1 is interposed between the collector of the transistor T1 and a supply voltage line 10; a further resistor R2 is interposed between the collector of the transistor T2 and the supply voltage line 10. The supply voltage may be applied to the supply voltage line 10 via a terminal $V_{CC}$. A terminal of a resistor R3 is connected to the emitter of the transistor T1, and a terminal of the transistor R4 is connected to the emitter of the transistor T2. The other terminals of the resistors R3 and R4 are both connected to a terminal of a resistor R5 whose second terminal is connected to a ground line 20.

As is familiar in connection with such differential amplifier stages, the resistors R1 through R5 determine the amplification factor. The amplification factor can also be influenced by means of an impedance interposed between the emitters. The resistor R5 is suitably made relatively high-ohmic so that it functions as a constant current source determining the quiescent current flowing through transistors T1 and T2 and thus also determines the operating point of the differential amplifier stage. The collector of the transistor T1 is connected to the base of a NPN output transistor T3. The collector of this output transistor T3 is connected to the supply voltage line 10 and its emitter is connected to the ground line 20 via a resistor R6. The collector of transistor T2 is connected to the base of a NPN output transistor T4, the collector of which is connected to the supply voltage line 10 and the emitter of which is connected to the ground line 20 via resistor R7. The emitter of the output transistor T3 is connected to the output terminal A1, and the emitter of the output transistor T4 is connected to the output terminal A2.

The amplifier additionally comprises two PNP transistors T5 and T6 whose base terminals are interconnected. The emitter terminals of the transistors T5 and T6 are connected to the supply voltage line 10 via resistors R8 and R9, respectively, and the base of the transistor T5 is connected to its collector. The collector of the transistor T5 is additionally connected to a control terminal ST.

The transistors T5 and T6 together form a so-called "current mirror" of known type. Such a current mirror includes an input transistor and an output transistor whose bases are interconnected and whose emitters are connected to a common terminal (ground or supply voltage) either directly or via resistors. In the input transistor the base and the collector are interconnected. In a current mirror there is a predetermined ratio between the current flowing through the collector-emitter circuit of the output transistor to the current flowing through the collector-emitter circuit of the input transistor. In the illustrated circuit the transistor T5 is the input transistor and the transistor T6 is the output transistor of the current mirror. The current flowing through the collector-emitter circuit of the transistor T5 is determined by a control current fed to the control terminal ST, and in the collector-emitter circuit of the transistor T6 a current flows which is in a predetermined ratio to the current flowing in the collector-emitter circuit of the transistor T5. In the illustrated circuit it has been assumed that the resistors R8 and R9 are equal with the consequence that the currents flowing through the collector-emitter circuits of the two transistors T5 and T6 are likewise equal. Assuming that the control current $I_{ST}$ flows through the transistor T5, a current $I'_{ST}$ equal to the control current $I_{ST}$ flows in the collector of the transistor T6 provided the resistors R8 and R9 are equal.

The collector of the transistor T6 is connected to the collector of an NPN transistor T7 which, together with an NPN transistor T8, forms a further current mirror. In the transistor T7 the collector is connected to the base and said transistor forms the input transistor of the current mirror. Its base is connected to the transistor T8 forming the output transistor of said further current mirror. The emitters of the transistors T7 and T8 are connected to the ground line 20 via identical resistors R10 and R11. This second current mirror effects that the current I2 flowing in the collector-emitter circuit of the transistor T8 is equal to the current flowing in the collector-emitter circuit of the transistor T7 on account of the resistors R10 and R11 being equal, i.e. that the current is equal to $I'_{ST}$.

The circuit contains a third current mirror formed by the transistor T5 and by a PNP transistor T9. This transistor T9 is the output transistor of the third current mirror. The base of the transistor T9 is connected to the base of the transistor T5 and its emitter is connected via a resistor R12 to the supply voltage line 10. The resistor R12 has the same value as the resistor R8. Said third current mirror has the effect that the current I1 flowing in the collector-emitter circuit of the transistor T9 is equal to the control current $I_{ST}$ flowing in the collector-emitter circuit of the transistor T5.

The collector of the transistor T8 is connected to the terminal 30 of a diode bridge 31 and the collector of the transistor T9 is connected to a further terminal 32 of said diode bridge. The two further terminals 33 and 34 of the diode bridge 31 are connected to the emitter of the transistor T1 and to the emitter of the transistor T2, respectively. The diodes D1, D2, D3 and D4 in the diode bridge are poled in such a way that the current flowing in the collector line of the transistor T9 can flow through the diode bridge to the collector line of the transistor T8. The terminals 30 and 32 are the dc terminals supplying direct current when alternating current is applied to the other two terminals 33 and 34, the ac terminals, in case the diode bridge 31 is used as a fullwave rectifier.

As explained above, the use of the current mirrors makes the current I1 as well as the current I2 equal to the control current $I_{ST}$. This implies that the current flowing in the circuit portion composed of the resistor R12, the transistor T9, the diode bridge 31, the transistor T8 and the resistor R11 does not cause any current to flow in the resistors R3, R4 and R5 which might influence the quiescent current flowing through the transistors T1 and T2. The value of the current flowing in said circuit portion thus has no influence whatever on the operating point of the amplifier stage formed by the transistors T1 and T2. This ideal case is achieved particularly when the diodes D1 to D4 have equal characteristics, which can be realized by producing said diodes on a common semiconductor wafer.

Variation of the current flowing through the diode bridge composed of diodes D1 to D4 varies the amplification factor of the amplifier stage formed by the transistors T1 and T2. The current I1=I2 flowing through the diode bridge is determined by the control current $I_{ST}$ applied to the control terminal ST. From the circuit diagram it becomes apparent that the current flows through the diodes of the diode bridge in forward direction. In case of the small currents (less than 2 milliamperes) the diodes behave like resistors with the consequence that a change of the current flowing through the diode bridge effects a change of the impedance effective between the emitters of the transistors T1 and T2 which impedance, in turn, is essential to the amplification factor of the amplifier stage formed by the transistors T1 and T2. In the illustrated circuit the restriction of the current flowing through the diode bridge to small values (less than 2 milliamperes) permits the utilization of the portion of the diode characteristics in which the diode current effects an appreciable change of the forward resistance of the diodes.

The current flowing through the diode bridge 31 does not have any influence on the quiescent current flowing in the amplifier stage formed by the transistors T1 and T2 but only changes the impedance effective between the emitters of said transistors. In view of the unchanged quiescent current also the operating point and thus the band width of the amplifier stage remains unaffected. The illustrated circuit arrangement is suited especially for the controllable amplification of video signals, i.e. signals of relatively high frequencies.

What is claimed is:

1. A high frequency amplifier comprising a pair of transistors forming a differential amplifier stage, means connected to the transistors for biasing them at an operating point, each transistor having an input terminal, an output terminal and a common terminal, in which the common terminals are connected to a first pair of terminals of a diode bridge, the diode bridge having a second pair of terminals connected to means for feeding a dc control current to vary the impedance of the bridge and hence the amplification factor of the amplifier without substantially changing the operating point of the transistors, wherein the means for feeding the d.c. control current includes two current mirrors having output transistors connected to respective ones of the second pair of terminals of the diode bridge and having input transistors connected to receive a control signal for varying the d.c. control current output of the current mirrors.

2. An amplifier according to claim 1, including a further current mirror circuit for receiving the control signal and for feeding equal dc control currents to the said two current mirrors.

3. An amplifier according to claim 1, in which the output terminals of the transistors of the differential amplifier stage are connected to respective output buffer amplifier stages.

4. A high frequency amplifier comprising a pair of transistors forming a differential amplifier stage, means connected to the transistors for biasing them at an operating point, variable impedance means connecting the emitters of the transistors for varying the amplification factor of the amplifier, wherein the variable impedance means comprises a diode bridge having a pair of a.c. terminals connected to the emitters of the transistors, and a controllable current source means connected to a pair of d.c. terminals of the bridge for feeding a d.c. control circuit to the diode bridge to vary the impedance of the bridge and the amplification factor of the amplifier without substantially changing the operating point of the said transistors.

5. An amplifier according to claim 4, wherein the collectors of the differential amplifier stage transistors are connected by respective emitter follower stages to outputs of the amplifier.

6. An amplifier according to claim 4, wherein the dc terminals of the bridge are connected to outputs of respective current mirror circuits controlled by a common control signal.

7. An amplifier according to claim 6, wherein each of the current mirror circuits is a bipolar transistor current mirror which includes an output transistor having a collector connected to one of the dc terminals of the bridge.

8. An amplifier according to claim 6, wherein one of the current mirrors has a further output transistor connected to supply the dc control current to the input transistor of the other current mirror, and wherein the said one current mirror has an input transistor for receiving the control signal.

* * * * *